(12) United States Patent
Kido et al.

(10) Patent No.: US 7,079,566 B2
(45) Date of Patent: Jul. 18, 2006

(54) SEMICONDUCTOR LASER APPARATUS CAPABLE OF ROUTING LASER BEAMS EMITTED FROM STACKED-ARRAY LASER DIODE TO OPTICAL FIBER WITH LITTLE LOSS

(75) Inventors: Motoi Kido, Futtsu (JP); Hirofumi Imai, Futtsu (JP); Naoya Hamada, Futtsu (JP)

(73) Assignee: Nippon Steel Corporation, Tokyo (JP)

( * ) Notice: Subject to any disclaimer, the term of this patent is extended or adjusted under 35 U.S.C. 154(b) by 0 days.

(21) Appl. No.: 11/271,429

(22) Filed: Nov. 10, 2005

(65) Prior Publication Data

US 2006/0126690 A1    Jun. 15, 2006

(30) Foreign Application Priority Data

Dec. 15, 2004    (JP)    ............................. 2004-363600

(51) Int. Cl.
*H01S 3/10* (2006.01)
*H01S 3/08* (2006.01)
*G02B 27/10* (2006.01)

(52) U.S. Cl. .................... 372/101; 372/9; 372/108; 359/624

(58) Field of Classification Search ................ 372/101
See application file for complete search history.

(56) References Cited

U.S. PATENT DOCUMENTS

2005/0063435 A1*    3/2005    Imai et al. .................... 372/43

FOREIGN PATENT DOCUMENTS

| JP | 2002239773 | 8/2002 |
| JP | 2003057588 | 2/2003 |
| JP | 2004096092 | 3/2004 |

* cited by examiner

*Primary Examiner*—Armando Rodriguez
(74) *Attorney, Agent, or Firm*—Dorsey & Whitney LLP

(57) ABSTRACT

A semiconductor laser apparatus according to an exemplary embodiment of the present invention is provided. For example, the apparatus may include a single or a plurality of stacked-array laser diodes, first beam compressors, and a separating optical device separating the group of laser beams into subgroups of laser beams in a first direction, and deflecting the subgroups of laser beams so that the subgroups of laser beams approach in the first direction and recede from one another in a second direction. In addition, a collimating optical device may be provided which is adapted to deflect the subgroups of laser beams in the first and second directions by the same angles. Further, a beam converter may be included which divides each subgroup of laser beams and turning the axis thereof, and second beam compressors and a group of cylindrical lenses can be provided that can make the angle of divergence in the first direction close to the angle of divergence in the second direction.

23 Claims, 16 Drawing Sheets

BEFORE PASSING THOUGH BEAM CONVERTER

AFTER PASSING THROUGH BEAM CONVERTER

SEMICONDUCTOR LASER APPARATUS CAPABLE OF ROUTING LASER BEAMS EMITTED FROM STACKED-ARRAY LASER DIODE TO OPTICAL FIBER WITH LITTLE LOSS

CROSS-REFERENCE TO RELATED APPLICATION(S)

This application is based upon and claims the benefit of priority from the prior Japanese Patent Application No. 2004-363600, filed on Dec. 15, 2004, the entire disclosure of which is incorporated herein by reference.

FIELD OF THE INVENTION

The present invention relates to a semiconductor laser apparatus, and more particularly, to the semiconductor laser apparatus that uses a beam conversion optical system to converge a group of laser beams radiated from a stacked-array laser diode, and routes the resultant group of laser beam to an optical fiber.

BACKGROUND INFORMATION

In recent years, a linear-array semiconductor laser having stripes of active layers formed one-dimensionally has been available in a continuous-wave oscillation type providing a power output of about 50 W. The linear-array semiconductor laser has stripes, which has a width ranging from 100 μm to 200 μm and has one ends thereof formed as emitters, equidistantly arranged on a planar basis at a density of 100 stripes per cm.

As shown in FIG. 2, several linear-array semiconductor lasers stacked in the form of a two-dimensional array are provided, whereby a power output is readily increased. The two-dimensionally arrayed semiconductor laser is referred to as a stacked-array laser diode, and a type of stacked-array laser diode providing a power output of several kilowatts is locally procurable. If a group of laser beams radiated from the stacked-array laser diode can be converged on an optical system and then routed to a fiber bundle through which the group of laser beams is propagated, the stacked-array laser diode can be adopted for a wide range of applications including laser processing.

Assuming that one stacked-array laser diode has N layers, the stacked-array laser diode radiates laser beams (a group of laser beams) numbering a product of about 100 by N. The stacked-array laser diode serves as a light source providing laser beams arranged in the form of a two-dimensional array. Moreover, high-power semiconductor lasers including a quasi-continuous wave ("CW") semiconductor laser have a number of emitters congested therein. An generated light may be mixed with light emitted from an adjoining emitter immediately after it is emitted, whereby the same number of nearly continuous linear light waves as the number of layers can be provided in parallel with one another.

Each of laser beams (e.g., a stripe light) is emitted from a flat light source. The angle of divergence of a component φ of the laser beam perpendicular to an active layer is large enough so as to range from about 40° to 50°, and the angle of divergence of a component θ thereof horizontal thereto is generally as small as to be about 10°. Hereinafter, a direction perpendicular to the active layer in which the angle of divergence is large shall be called a "fast axis," and a direction horizontal to the active layer in which the angle of divergence may be called a "small axis." Each of the stripes has a width that may be as small as 1 μm or less in the fast axis, and each may have a length of about 100 μm in the slow axis are congested. Therefore, the stripes serving as linear light sources respectively may constitute a light source having a width of approximately 10 mm.

Assuming that an ordinary lens or the like is used to converge a group of laser beams emitted from the stacked-array laser diode, the fast-axis components of the laser beams are readily converged to have a diameter of several hundreds of micrometers. However, the slow-axis components thereof are hardly converged to have a diameter of several millimeters. A high power density that is a feature of laser processing is not attained readily. Japanese Unexamined Patent Publication (Kokai) No. 2004-096092, the entire disclosure is incorporated herein by reference, describes a method of using an optical system, which improves the property of convergence of slow-axis components, to drastically reduce the diameter of a spot of a converging light to several hundreds of micrometers or less.

Particular aspects of the conventional systems and methods, and certain problems associated therewith are described in detail below with reference to the accompanying drawings, in comparison with the exemplary embodiments of the present invention.

SUMMARY OF THE INVENTION

One of the objects of the present invention is to provide a semiconductor laser apparatus capable of routing laser beams emitted from a stacked-array laser diode to an optical fiber with a little loss.

According to one exemplary embodiment of the present invention, a semiconductor laser apparatus can be provided which includes a single stacked-array laser diode or a plurality of stacked-array laser diodes that has a plurality of emitters, each of the emitters is (i) elongated in a direction in which a laser beam is emitted, (ii) arranged in a first direction and a second direction orthogonal to the first direction in the form of a two-dimensional array, and (iii) emits a group of laser beams layered in rows. The laser apparatus also includes a first condenser that is disposed in front of the stacked-array laser diode, and that refracts (row by row) the group of laser beams in the second direction so as to collimate the group of laser beams. First beam compressors are disposed in front of the first condenser 20, and (i) receive the group of laser beams collimated in the second direction, (ii) convert the group of laser beams into a group of laser beams having an inter-ray axis distance thereof in the second direction shortened, and then (iii) radiate the resultant group of laser beams.

In addition, the laser apparatus has a separating optical device that is disposed in front of the first beam compressor, and which (i) separates the group of laser beams into subgroups of laser beams in terms of the first direction, and (ii) deflects the subgroups of laser beams so that the subgroups of laser beams will approach in terms of the first direction and will recede from one another in terms of the second direction. A collimating optical device is provided which is disposed in front of the separating optical device, and that deflects the subgroups of laser beams in terms of the first and second directions by the same angles as the angles (by which the separating optical device have deflected them) in directions opposite to the directions in which the separating optical device have deflected the subgroups of laser beams.

A beam converter can also be provided (which is disposed in front of the collimating optical device) which has optical elements (which divide each subgroup of laser beams) that is included in a row in the group of laser beams. The subgroup of the laser beams can be subdivided into portions and which bend nearly at right angles the axis of a section of a plurality of laser beams belonging to each portion, juxtaposed in rows. The beam converter receives the group of laser beams emitted from the collimating optical device, and allows each of the optical elements to turn the axis of a section of a plurality of laser beams belonging to each portion. The beam converter radiates a substantially ladder-shaped group of laser beams extending in tandem in the first direction in units of the plurality of laser beams belonging to each portion.

Further, second beam compressors can be disposed in front of the beam converter, and can convert the received group of laser beams into a group of laser beams having been compressed in the first direction, and radiate the resultant group of laser beams. A group of cylindrical lenses may be disposed in front of the second beam compressors which make the angle of divergence in the first direction close to the angle of divergence in the second direction. A condenser lens can be provided that converges the group of laser beams, and an optical fiber having an end surface thereof located at the position of the focal point of the condenser lens may be included as well.

According to another exemplary embodiment of the present invention, the semiconductor laser apparatus may have an optical device which refracts laser beams in the second direction so as to collimate them, and then radiates the resultant laser beams. The optical device may be interposed between the collimating optical device and the beam converter. In such case, the collimating optical device can include, for example, a cylindrical lens.

In a further exemplary embodiment of the present invention, the first and second beam compressors may include, for example, telescopes each formed with a lens that exhibits a curvature in one direction alone. Alternatively, the first and second beam compressors can include telescopes each formed with a mirror that exhibits a curvature in one direction alone, and/or anamorphic prisms or pairs of anamorphic prisms respectively.

The beam converter may include compound optical devices. Each of the compound optical devices may haves, for example, (i) a receiver that receives an incident beam whose section perpendicular to the optical axis of the compound optical device has a first axis, (ii) an optical system that turns the first axis of the section of the beam nearly at right angles, and (iii) an emitter that emits the beam having passed through the turning optical system. Each of the compound optical devices may have the receiver and emitter flushed with each other adjacently to each other along the ray axis of a laser beam. The optical device can have a shape which is determined with reflecting surfaces thereof, and may include a first reflecting surface (formed vertically to meet an incident beam at an angle of nearly 45°), a second reflecting surface (formed to be parallel to the incident beam to meet a horizontal surface at an angle of nearly 45°), and a third reflecting surface formed to be perpendicular to a vertical surface parallel to the incident beam (to be parallel to a line of intersection between the first and second reflecting surfaces, and to meet the horizontal surface at an angle of nearly 45°).

Moreover, the beam converter may include a plurality of prisms each having, for example, a first totally reflecting surface, a second totally reflecting surface, a third totally reflecting surface, an incidence surface, an emission surface, and a joint surface. The first, second, and third totally reflecting surfaces of each of the plurality of prisms meet at an angle of intersection of approximately 60°. The incidence surface and emission surface that are parallel to each other are orthogonal to the second totally reflecting surface, and meet the first and third totally reflecting surfaces at an angle of nearly 45°. The joint surface is parallel to the second totally reflecting surface. The beam converter can have the plurality of prisms juxtaposed in the form of a one-dimensional array while having the third totally reflecting surfaces, incidence surfaces, and emission surfaces of the plurality of prisms flushed with one another adjacently to one another, and having the joint surfaces and second totally reflecting surfaces thereof joined.

Further, the beam converter may have optical glass bodies juxtaposed in the form of a one-dimensional array. Each of the optical glass bodies can haves first and second flat surfaces that are parallel to each other, a third flat surface that meets the first flat surface at an angle of 135°, and a fourth flat surface that is a cylindrically folded surface having ridges and valleys, along each of which slopes meet at an angle of 60° and each of which is parallel to the third flat surface, formed alternately continuously (like a washing plate) to intersect the first flat surface at an angle of $\tan^{-1}(1/\sqrt{2})$. The first flat surface may serve as an incidence surface, and the second flat surface can serve as an emission surface. Some of the slopes constituting the fourth surface which meet the first flat surface at an angle of 45° serve as first reflecting surfaces, and the other slopes thereof may serve as second reflecting surfaces. The third flat surface can serve as a third reflecting surface.

In addition or alternatively, the beam converter may have mirror structures juxtaposed in the form of a one-dimensional array. Each of the mirror structures has a first flat surface that meets a flat surface perpendicular to an incident ray axis at an angle of 135°, and a second surface that is a cyclically folded surface having ridges and valleys, along each of which slopes meet at an angle of 60° and each of which is parallel to the first flat surface, formed alternately and continuously (like a washing plate) to intersect the flat surface perpendicular to the incident ray axis at an angle of $\tan^{-1}(1/\sqrt{2})$. The first flat surface and the second surface are finished as mirrors. Some of the slopes constituting the second surface that meet the flat surface perpendicular to the incident ray axis at an angle of 45° can serve as first reflecting surfaces, and the other slopes serve as second reflecting surfaces. The first flat surface serves as a third reflecting surface. Otherwise, the beam converter may have a plurality of pairs of convex cylindrical lenses, of which optical axes are tilted nearly 45°, opposed to one another in the form of a one-dimensional array. In this case, the curvature of an emission-side lens of each pair of cylindrical lenses may be smaller than the curvature of an incidence-side lens thereof.

The beam converter 50 may have a plurality of cylindrical lenses, each of which has a convex lens portion formed at both lateral ends, joined in the form of a one-dimensional array to meet an incident beam at an angle of nearly 45°. In this case, the curvature of an emission-side one of the convex lens portions may be smaller than the curvature of an incidence-side one thereof. The beam converter may also have a plurality of cylindrical surfaces, which are tilted nearly 45° in nearly the same direction, formed on both the incidence and emission sides of an optical glass prism having a rectangular section. A beam incident on each of the cylindrical surfaces is emitted with the section of the incident beam turned nearly 90°. In this case, the curvature of the emission-side ones of the cylindrical surfaces may be smaller than the curvature of the incidence-side ones thereof. Moreover, the optical device may include, for example, a dove prism having a trapezoidal section. A plurality of optical devices can be tilted nearly 45°. Further, the optical device may have a plurality of pairs of optical elements, each of which varies a power in a direction perpendicular to a center axis thereof due to diffraction, opposed to one another with the center axes tilted nearly 45°.

At least two stacked-array laser diodes may also be provided. A first condenser can be included that refracts row by row a group of laser beams in the second direction so as to thus collimate the group of laser beams may be disposed in front of each of the stacked-array laser diodes. At least one combining optical device that combines a group of laser beams emitted from at least another condenser may be disposed in front of at least one of the condensers. Further, at least two stacked-array laser diodes may be included, and a combining optical device that combines at least two groups of laser beams incident on a condenser lens may be disposed behind the condenser lens. Moreover, at least three stacked-array laser diodes (each having a first condenser disposed in front thereof) may be included. At least one combining optical device that combines at least two groups of laser beams may be disposed in front of each of the first condensers, and/or at least one combining optical device that combines at least two groups of laser beams incident on a condenser lens may be disposed behind the condenser lens. In this case, the combining optical device may include, for example, a polarization device.

In addition, the combining optical device may be realized with, for example, a dichroic mirror. The combining optical device may be realized with, for example, mirrors disposed at the same pitch as a pitch between adjoining ones of the emitters included in the stacked-array laser diode 10.

BRIEF DESCRIPTION OF THE DRAWINGS

The present invention will be more clearly understood from the description of the preferred embodiments as set forth below with reference to the accompanying drawings, wherein.

DETAILED DESCRIPTION

Figure 1:
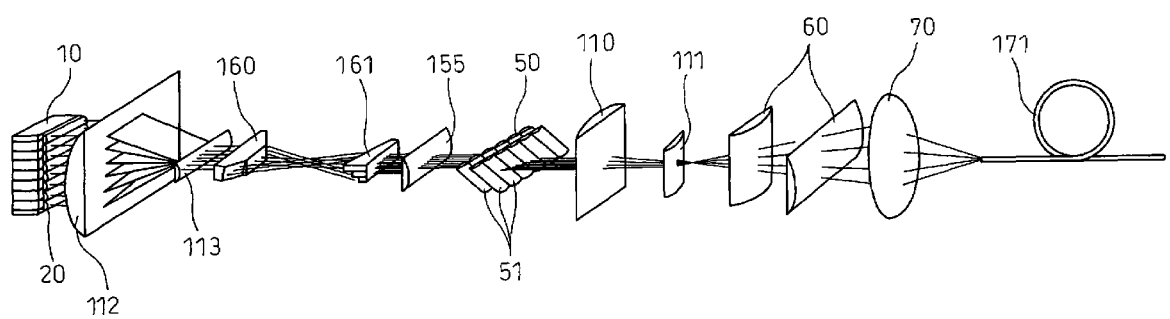
FIG. 1 schematically shows semiconductor laser apparatus in accordance with an embodiment of the present invention in which a cylindrical lens telescope is adopted as a compressor.

For the purposes of the discussion provided herein below, with respect to one exemplary embodiment of the present invention, a position in front of an optical device can signify a position on the side of a point at which the optical device converges light, and a position behind the optical device signifies a position on the side of a light source (opposite to the position in front of the optical device). Moreover, the same reference numerals as those employed in description of exemplary embodiments of the present invention will be used throughout this document. In the specification and drawings, the same reference numerals will be assigned to components having substantially the same functions. It should be noted that the reference numerals are used merely for a further understanding, and in no way meant to, in any way, restrict the present invention to those described herein.

Prior to describing exemplary embodiments of the present invention, a conventional semiconductor laser devices and certain problems associated are described.

As discussed above, a converging optical system as described in Japanese Unexamined Patent Publication (Kokai) No. 2004-096092,, the entire disclosure of which is incorporated herein by reference, has previously been used. With such system, immediately before a laser beam is introduced to a final condenser lens, the diameter of a fast-axis component of the laser beam and an angle of divergence thereof should be made close to the diameter of a slow-axis component and an angle of divergence thereof. A sine of a half α of an angle of convergence at the position of the focal point of the final condenser lens is about 0.3 that is larger than a numerical aperture (NA) (=about 0.2) permitted by an ordinary optical fiber.

Figure 19:
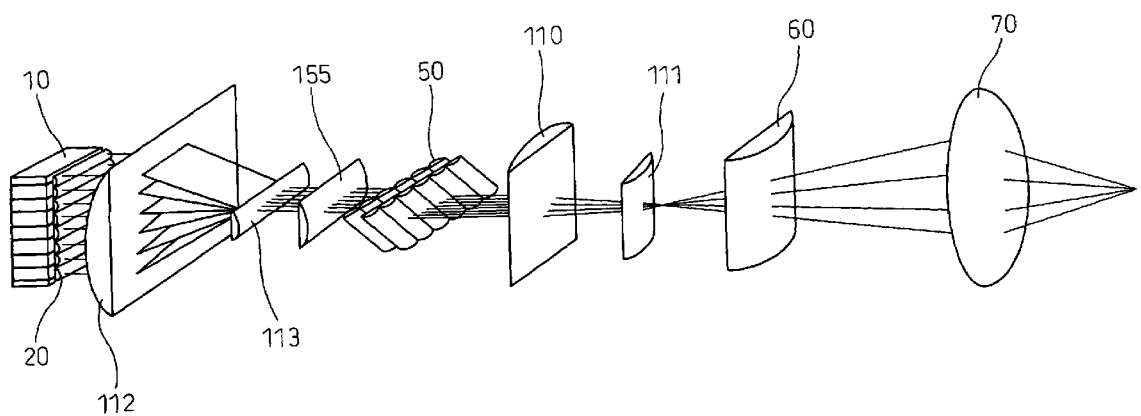
FIG. 19 is a conventional semiconductor laser apparatus.

A description of such conventional device/system is provided below with reference to FIG. 19. In particular, such optical system includes a beam converter 50 is used to separate laser beams and turn them approximately 90° to improve the converging property of the slow-axis components of the laser beams. Accordingly, the fast-axis components are compressed by an inter-ray axis distance corresponding to an inter-emitter distance of a stacked-array laser diode in two stages. In particular, in the first stage, the fast-axis components are compressed by compressors 112 and 113 located behind the beam converter 50. In the second stage, slow-axis components (which include the rotated fast-axis components) resulting from separation and approximately 90°-rotation performed by the beam converter 50 are compressed by the compressors 110 and 111. The angle of divergence of the fast-axis components having been compressed in the two stages by the inter-emission distance increases inversely proportionally to the ratio of compression. Due to the divergence, the diameter of the slow-axis components (including fast-axis components) is larger than the diameter of the fast-axis components (including slow-axis components) at a position immediately preceding a final condenser lens. Therefore, the sine of the half α of the angle of convergence at the position of the focal point of the final condenser lens 70 is about 0.3. The system of FIG. 19 also includes a stacked-array laser diode 10, a first cylindrical lens array 20, an optical device 155, and a group of cylindrical lenses 60.

As discussed above, it may be difficult to direct laser light (which is emitted from a stacked-array laser diode that is a light source having segments juxtaposed in the form of a two-dimensional array) to an ordinary optical fiber, and propagate the laser light through the optical fiber with a small loss. Other than for a special idea permitting propagation of laser light through an optical fiber, a conventional stacked-array semiconductor laser may not be utilized for laser processing—a significant industrial field of application of lasers or for medical purposes.

FIG. 1 shows an schematic diagram of an semiconductor laser apparatus in accordance with an exemplary embodiment of the present invention. For example, a stacked-array laser diode 10 (e.g., a light source) is part of or associated with the semiconductor laser apparatus, and emits laser beams whose shape and angle of divergence are different between the fast-axis components and the slow-axis components. In particular, the slow-axis components of the laser beams may be more difficult to converge. Therefore, an optical device can be used to converge the slow-axis components at a point. However, as described above, the angle of convergence of the laser beams attained at the focal point of a final condenser lens 70 is large such that the laser beams may not be propagated through an ordinary optical fiber. Therefore, a pair of optical devices 160 and 161 in accordance with an exemplary embodiment of the present invention can be used to restrict the diameter of laser beams attained in a converging system. In this manner, the angle of convergence at the focal point of the condenser lens 70 can become appropriate. Consequently, the laser beams can be propagated through the optical fiber 171.

Figure 2:
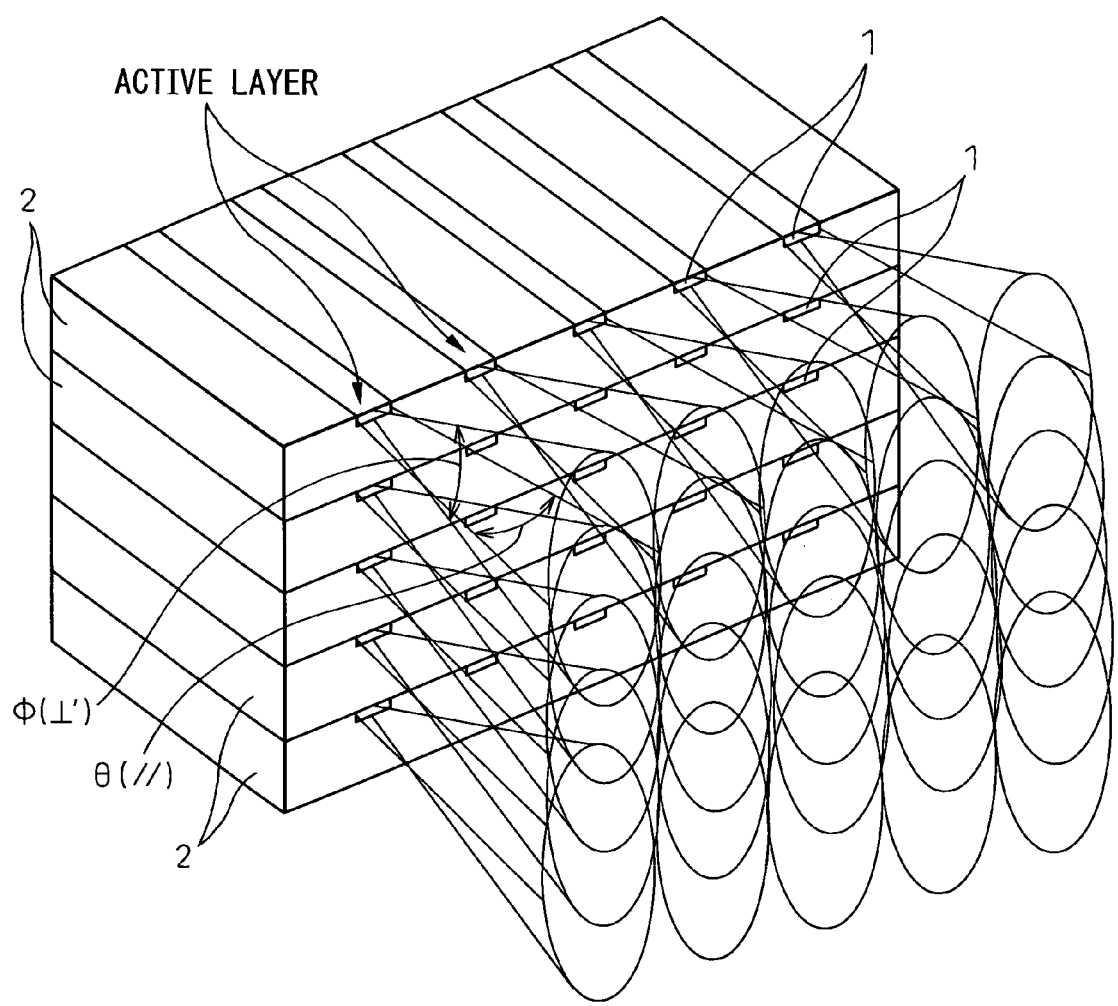
FIG. 2 is a perspective view showing a stacked-array laser diode explanatory of the directivity of a laser beam.

As shown in FIG. 2, the stacked-array laser diode 10 may have linear-array laser diodes 2, each of which possibly having, e.g., ten to one hundred active-layer stripes (emitters) 1 juxtaposed in a row within a width of approximately 10 mm, stacked in parallel. In this manner, the height of the stacked-array laser diode can be between approximately 20 mm and 40 mm. In this manner, the active-layer stripe emits a laser beam.

Figure 3:
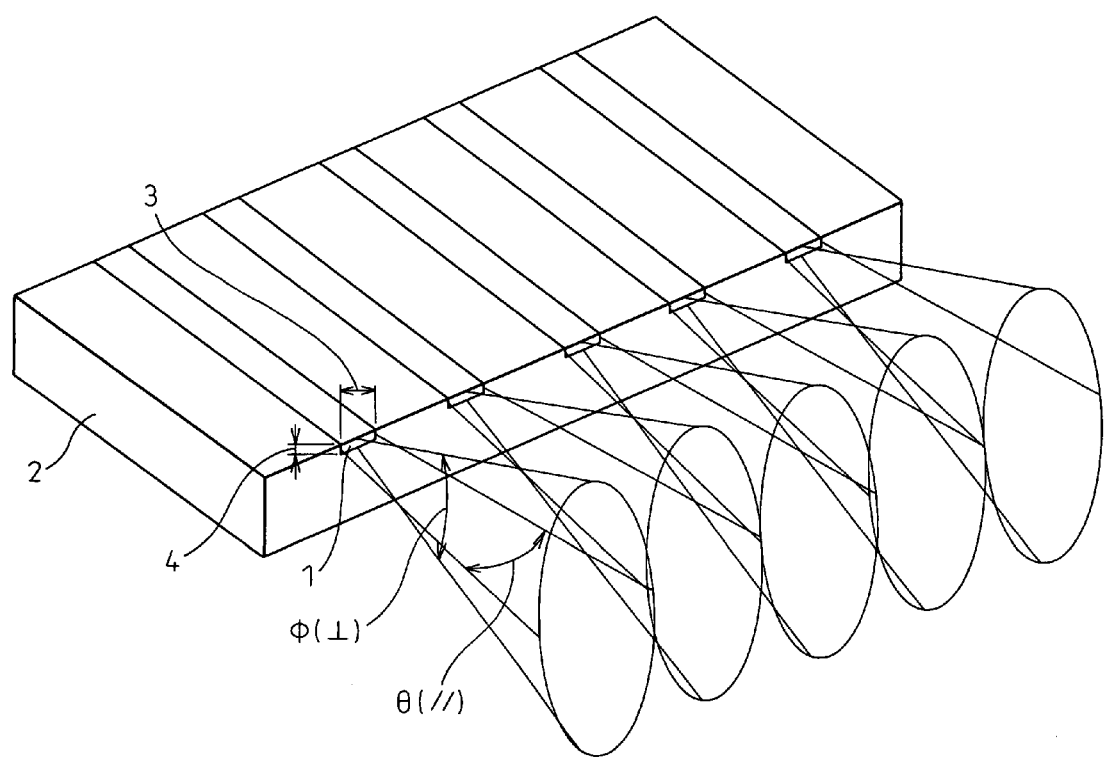
FIG. 3 is a perspective view showing a linear-array laser diode included in a stacked-array laser diode.

As shown in FIG. 3, a section of each active-layer stripe 1 may have, for example, a width 3 which can be between approximately 100 μm and 200 μm, and a thickness 4 of approximately 1 μm or less. The stacked-array laser diode 10 has a plurality of active-layer stripes 1, which are elongated in a direction in which laser beams are emitted, arranged in a first direction (horizontal direction in the drawing) and in a second direction orthogonal to the first direction (vertical direction in the drawing) in the form of, e.g., a two-dimensional array. The stacked-array laser diode 10 can thus emit a group of laser beams layered in rows. The laser beam emitted from the end of each active-layer stripe 1 is propagated in the fast axis (second direction) at an angle of radiation φ ranging from approximately 40° to 50°, and in the slow axis (first direction) at an angle of radiation θ of approximately 10°.

As shown in FIG. 1, a first cylindrical lens array 20 acts as a first condenser to refract (row by row) a group of laser beams emitted from the stacked-array laser diode 10 in the second direction. In this manner, the group of laser beams disposed in front of the stacked-array laser diode are collimated. The first cylindrical lens array 20 has approximately an equal optical thickness in the first direction, and therefore can cause laser beams to travel nearly rectilinearly. The angle of radiation of the slow-axis components of the laser beams can be approximately 10° or may remains unchanged from the angle of radiation attained at the active-layer stripes 1.

The system of FIG. 1 includes first beam compressors 112 and 113 that convert a received group of laser beams into a group of laser beams having an inter-ray axis distance in the second direction shortened. The resultant group of laser beam, which are disposed in front of the first cylindrical lens array 20 are irradiated by the compressors 112 and 113. The first beam compressors 112 and 113 compress the inter-ray axis distance in the second direction and provide laser beams that can be treated as one quasi-laser beam.

A separating optical device 160 may be disposed in front of the first beam compressors 112 and 113. The separating optical device 160 separates a group of laser beams into subgroups of laser beams in terms of the first direction, and deflects the subgroups of laser beams so that the subgroups of laser beams will approach in terms of the first direction and will recede from one another in terms of the second direction.

A collimating optical device 161 can be disposed in front of the separating optical device 160. The collimating optical device 161 deflects the subgroups of laser beams in the first and second directions at approximately the same angles as the angles at which the separating optical device 160 has deflected them (e.g., in directions opposite to the directions in which the separating optical device has deflected them). An optical device 155 is provided which is interposed between the collimating optical device 161 and a beam converter 50. The optical device refracts the subgroups of laser beams in the second direction so as to collimate them, and radiates the resultant group of laser beams. The subgroups of laser beams deflected by the separating optical device 160 are deflected in terms of the slow axis (e.g., a first direction) and the fast axis (e.g., a second direction) by the same angles as the angles with which the separating optical device 160 has deflected them (in the opposite directions by means of the collimating optical device 161). This results in a production of a group of parallel laser beams. The optical devices 160 and 161 can be disposed so that they will make the diameter in the slow axis of the group of laser beams smaller than the diameter attained when the group of laser beam enters the separating optical device 160. In the exemplary embodiment of the system of FIG. 1, an oblique prism having three surfaces can be used as the separating optical device 160 and the collimating optical device 161. The diameter in the slow axis may be reduced from 3A to A (approximately, a one-third of the size), and the diameter in the fast axis can be increased from B to 3B (approximately, triple the size).

Figure 4:
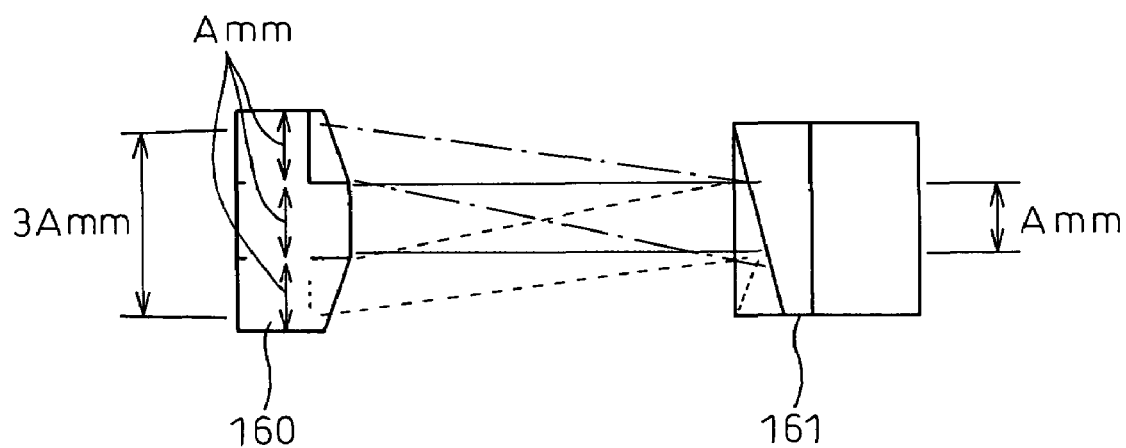
FIG. 4 is a top view showing a separating optical device and a collimating optical device explanatory of the behavior of a laser beam.
Figure 5:
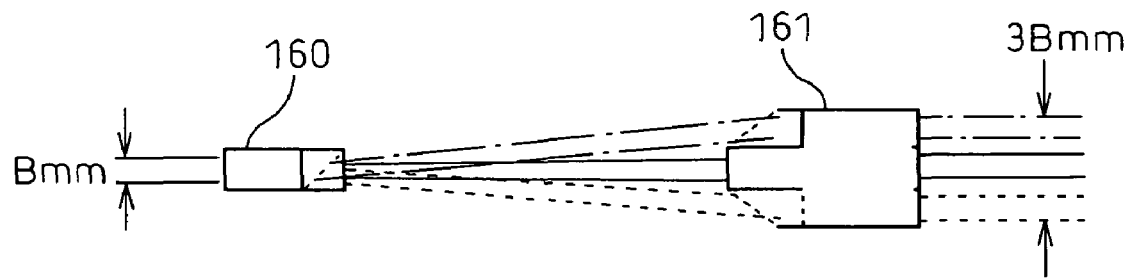
FIG. 5 is a side view showing the separating optical device and collimating optical device explanatory of the behavior of a laser beam.

The characteristics of laser beams is described below in conjunction with the separating optical device 160 and the collimating optical device 161 shown as a top view in FIG. 4 and as a side view of FIG. 5. The separating optical device 160 shown in FIG. 4 can be a prism having three surfaces on the emission side thereof. The separating optical device 160 may trisects incident beams in terms of the slow axis (in units of A) and deflects them so that they will approach. The collimating optical device 161 can be realized using a prism having a vertex in a direction opposite to the direction of the deflected laser beams so that it can collimate the laser beams that are deflected by the separating optical device 160. At the same time, the surfaces of the prism serving as the separating optical device 160 can be provided so that the separated laser beams may recede from one another in terms of the fast axis (e.g., 3B). The prism serving as the collimating optical device 161 has a vertex in a direction opposite to the direction, in which the vertex of the prism serving as the separating optical device is oriented, for the purpose of collimation.

Consequently, the diameter in the slow axis of the group of laser beams emitted from the collimating optical device 161 can become approximately one-third (e.g., approximately A), while the diameter in the fast axis thereof becomes approximately triple (e.g., approximately 3B). For example, the group of laser beams should pass through the optical device 155 that refracts the group of laser beams in the fast axis so as to thus collimate it. In this manner, the increase in the diameter in the fast axis can be compensated. In FIG. 1, a cylindrical lens can be used as the optical device 155. Alternatively, any other optical device having a non-cylindrical surface may be utilized.

A beam converter 50 may be disposed in front of the collimating optical device 161 and the optical device 155. The beam converter 50 generally has optical devices 51 juxtaposed in rows and/or columns. The optical devices 51 divide each subgroup of the laser beams lined in a row/column into portions, and bend the axis of the section of a plurality of laser beams belonging to each portion. In the beam converter 50, the optical devices 51 can receive a group of laser beams emitted from the collimating optical device 161 and turn the axis of the section of a plurality of laser beams belonging to each portion. Consequently, the beam converter 50 may radiate a substantially ladder-shaped group of laser beams extending in tandem in the first direction in units of a plurality of laser beams belonging to each portion. The group of laser beam emitted from the optical device 155 can be converted into a plurality of subgroups of laser beams, each of which has a small diameter in the slow axis, by the beam converter 50. Thereafter, the laser beams can be turned substantially 90° with a beam propagating direction as an axis. The diameter in the slow axis of the laser beams emitted from the beam converter 50 can be approximately identical to the diameter of the laser beams emitted from the collimating optical device 161 (e.g., approximately a one-third of the width in the slow axis of the stacked-array laser diode 10). The slow-axis components of the laser beams may include the fast-axis components of laser beams emitted from the stacked-array laser diode 10.

Second beam compressors 110 and 111 that convert a received group of laser beams into a group of laser beams having been compressed in the first direction are disposed in front of the beam converter 50. A group of cylindrical lenses 60 that makes the angle of divergence in the first direction close to the angle of divergence in the second direction can be disposed in front of the second beam compressors 110 and 111. Furthermore, a condenser lens 70 that converges a group of laser beams on the focal point thereof may be disposed in front of the cylindrical lenses 60. An optical fiber 171 which is disposed following the condenser lens 70 has the end surface thereof located at the position of the focal point of the condenser lens 70.

As described above, a group of laser beams that is turned substantially 90° by the beam converter 50 is compressed in the slow axis by the second beam compressors 110 and 111 in order to eliminate an inter-beam distance, and then passed through the cylindrical lenses 60 that adjusts the diameter in the slow axis and the diameter in the fast axis. Further, the group of laser beams is converged by the condenser lens 70. The resultant group of laser beams falls on the optical fiber 171 whose end surface is located at the position of the focal point of the condenser lens 70, and travels along the optical fiber 171. Using the exemplary embodiment of the semiconductor laser apparatus according to the present invention, the diameter of slow-axis components (including fast-axis components) attained at the final condenser lens 70 can be approximately one-third of a diameter of slow-axis components produced by the conventional apparatus.

The sine of the half $\alpha$ of the angle of convergence at the focal point can be equal to or smaller than a numerical aperture (NA=about 0.2) permitted by the optical fiber along which a laser beam travels. Consequently, the group of laser beams can be routed to the optical fiber at an angle of incidence smaller than an angle determined with the numerical aperture permitted by the optical fiber. In addition, a laser beam can be propagated through an ordinary optical fiber. The stacked-array laser diode can be used for laser processing, which is a major industrial field of application of a high-power laser, or medical purposes in a general-purpose manner.

Figure 6:
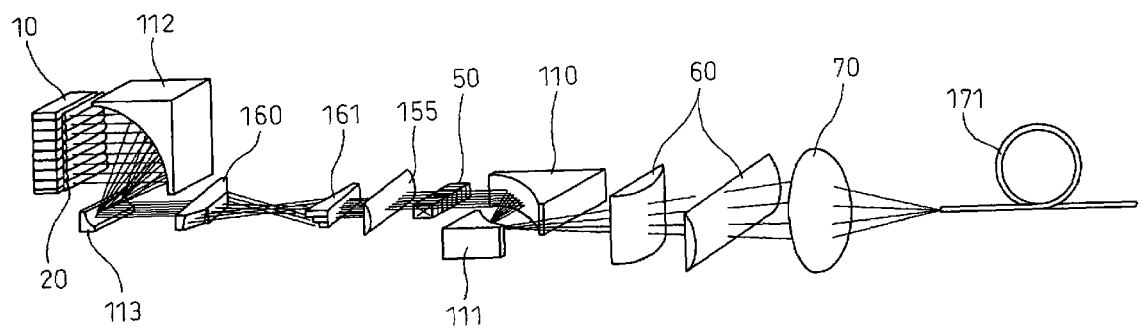
FIG. 6 is a schematic view of a semiconductor laser apparatus an accordance with an exemplary embodiment of the present invention in which a parabolic mirror telescope is adopted as first and second beam compressors.
Figure 7:
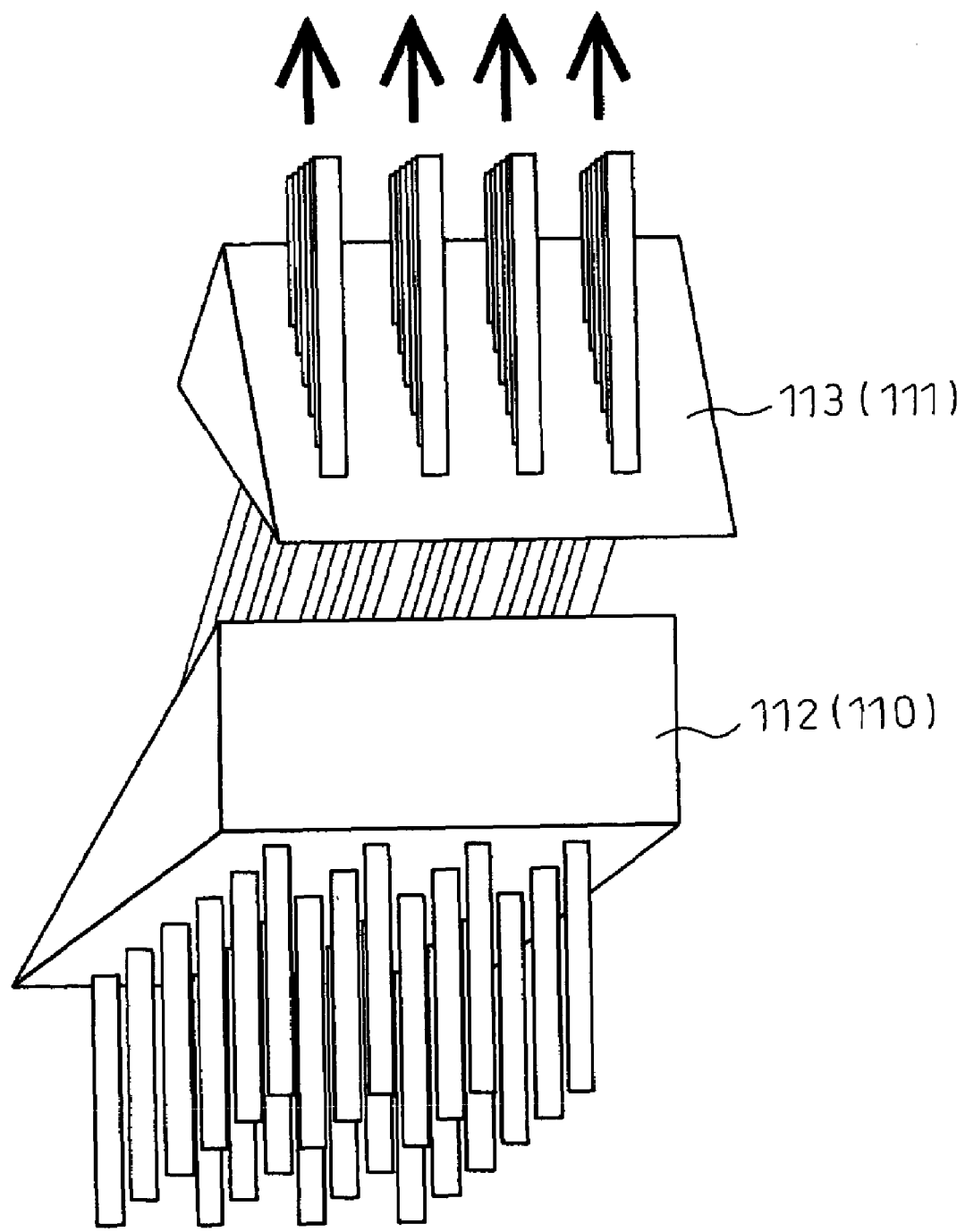
FIG. 7 is a schematic view of the semiconductor laser apparatus in accordance with another exemplary embodiment of the present invention in which a pair of anamorphic prisms is adopted as first and second beam compressors.

One exemplary embodiment of the semiconductor laser apparatus according to the present invention and the results using such apparatus have been described above. Indeed other exemplary embodiments can be utilized in accordance with the present invention. Referring again to FIG. 1, a telescope obtained with a cylindrical lens can be adopted as the first and second beam compressors 112, 113, 110, and 111. Alternatively, as shown in FIG. 6, a telescope obtained with a parabolic mirror may be adopted as the first and second beam compressors 112, 113, 110, and 111. The telescope may be of a Keplerian type or a Galilean type. Moreover, as shown in FIG. 7, an anamorphic prism or a pair of anamorphic prisms may be adopted as the first and second beam compressors 112, 113, 110, and 111.

Figure 8:
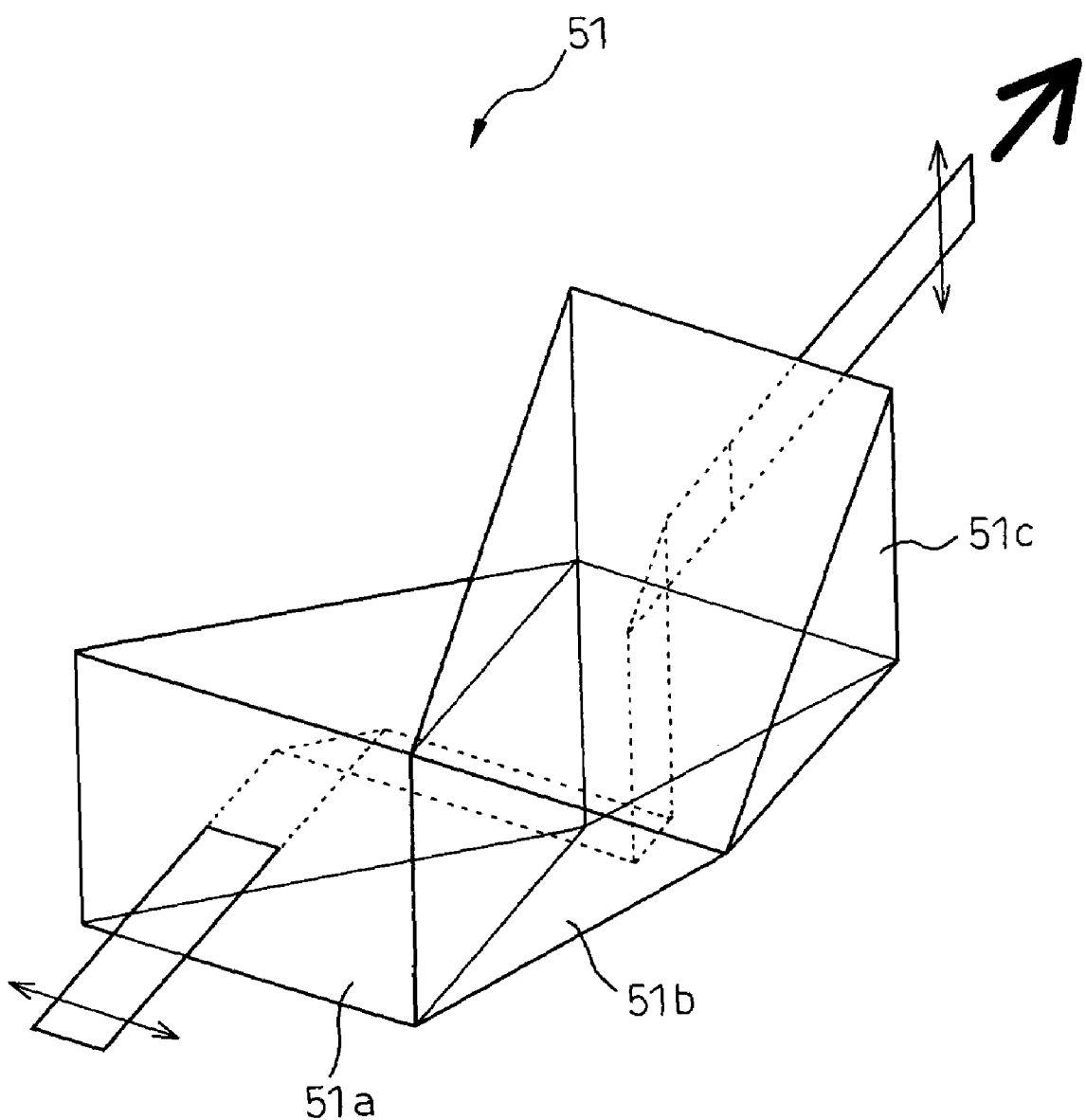
FIG. 8 is a diagram illustrating exemplary principles of a beam conversion to be achieved via three reflections using three rectangular prisms.

In addition, the optical devices 51 constituting the beam converter 50 and separating or rotating laser beams may be (as described in, for example, U.S. Pat. No. 5,513,201, the entire disclosure of which is incorporated herein by reference) produced based on various principles. First, a principle based on torsion deriving from three reflections may be utilized. The use of three rectangular prisms 51a, 51b, and 51c makes it easy to understand the exemplary principle. For example, the three rectangular prisms 51a, 51b, and 51c can be, as shown in FIG. 8, combined with one another. When a sideways-oriented flat laser beam is routed to the first rectangular prism 51a, a lengthwise-oriented flat laser beam having been twisted 90° due to three total reflections occurring in the first, second, and third prisms 51a, 51b, and 51c respectively is emitted from the third rectangular prism 51c.

Figure 9:
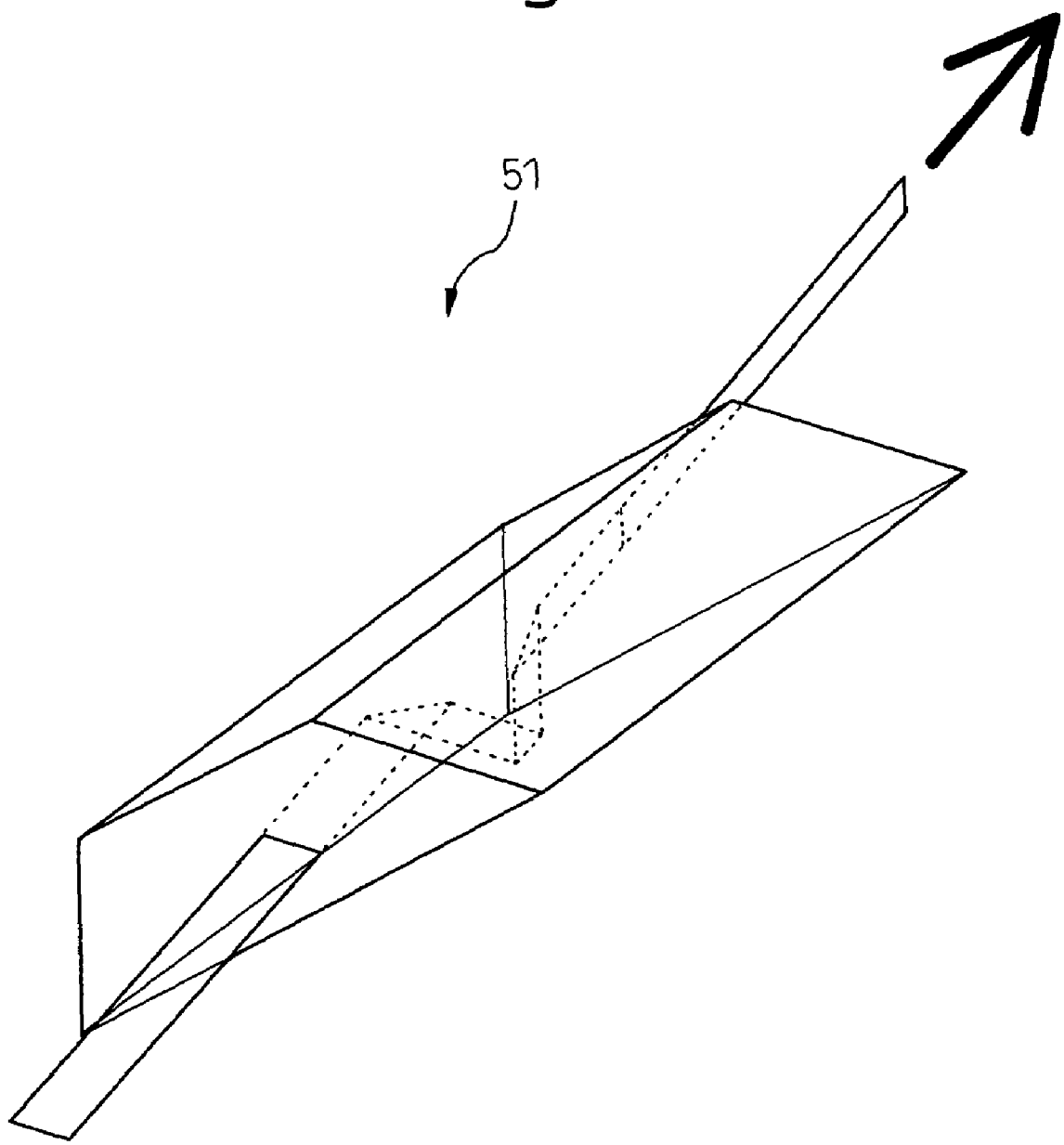
FIG. 9 is a perspective view of an optical device that is shaped like an oblique prism and uses one prism to fulfill a function provided by three rectangular prisms in accordance with the exemplary embodiment of the present invention.
Figure 10:
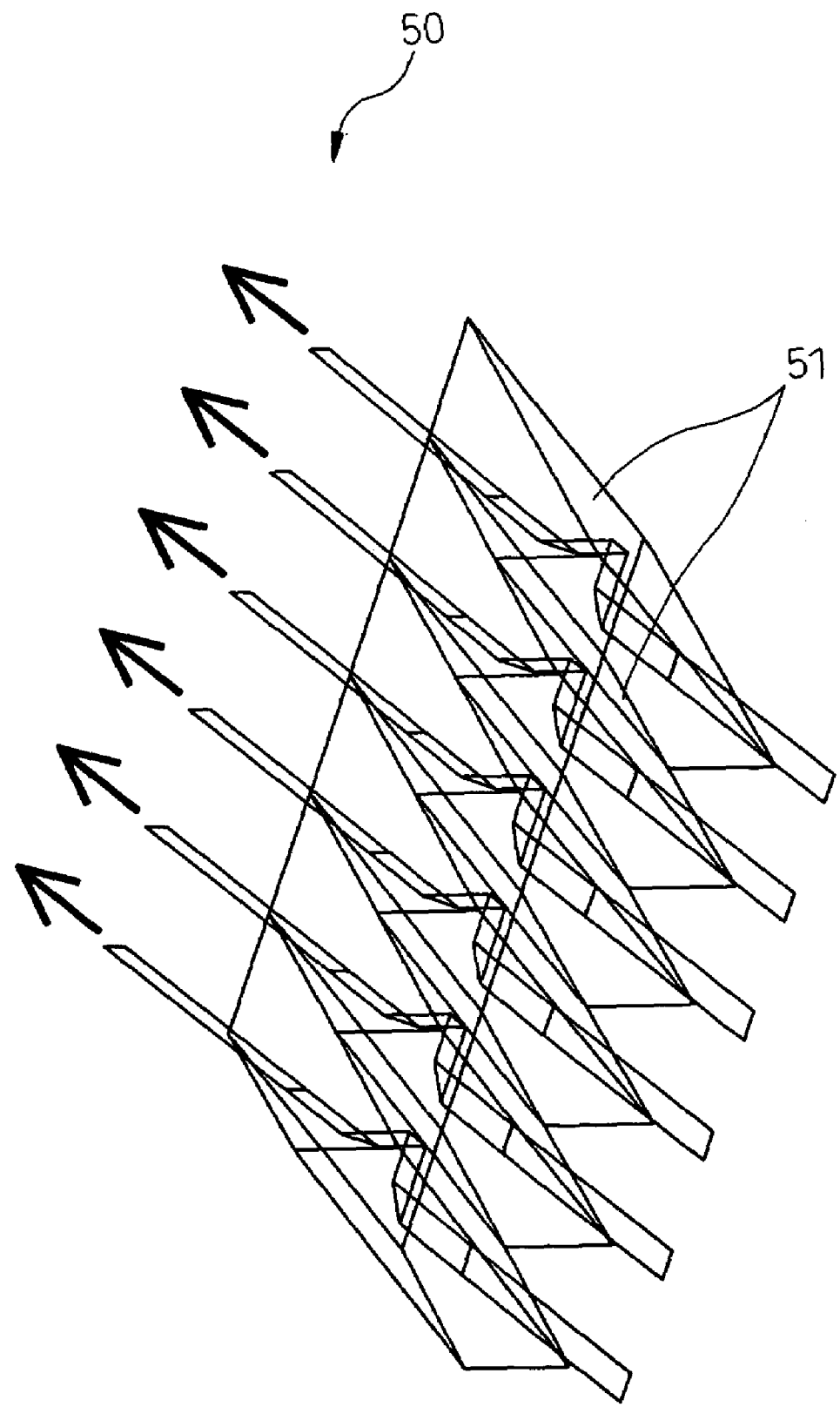
FIG. 10 is a perspective view of a beam converter according to the exemplary embodiment of the present invention having optical devices, an example of which is shown in FIG. 9, juxtaposed, and beam conversion to be achieved.
Figure 11:
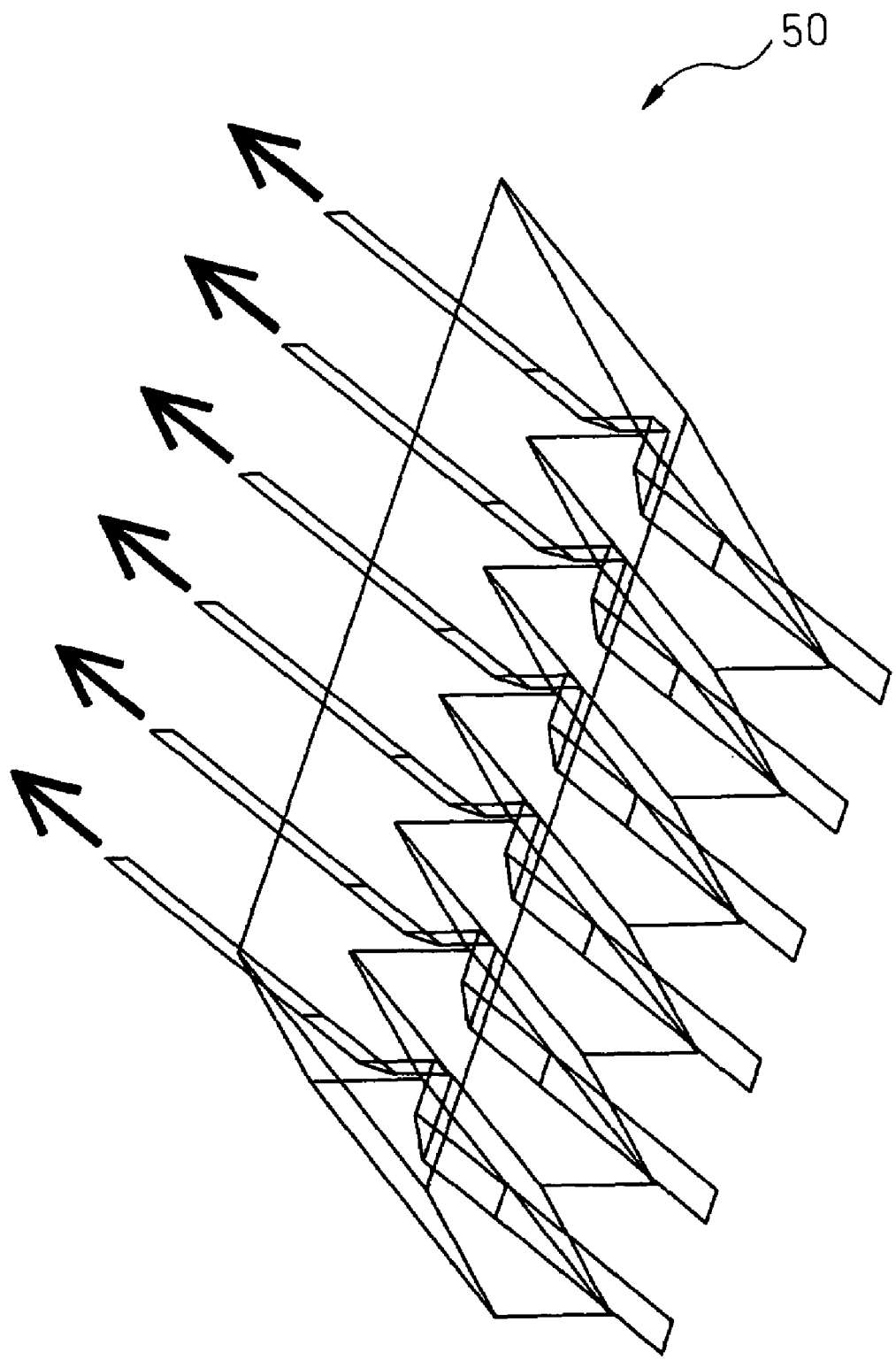
FIG. 11 is a perspective view of a monolithic beam converter according to the exemplary embodiment of the present invention similar to the beam converter shown in FIG. 10, and beam conversion to be achieved.

The function that can be accomplished by the three rectangular prisms may be fulfilled using an optical device 51 shaped like an oblique prism and realized with one prism shown in FIG. 9. When the beam converter 50 has, as shown in FIG. 10, such optical devices 51 juxtaposed in the form of a one-dimensional array, the beam converter 50 may receive laser beams lined in series like a dashed line, and emits laser beams concatenated like a ladder. The beam converter 50 (prism array) may be, like a beam converter 50 shown in FIG. 11, monolithically made from one glass substrate.

Figure 12:
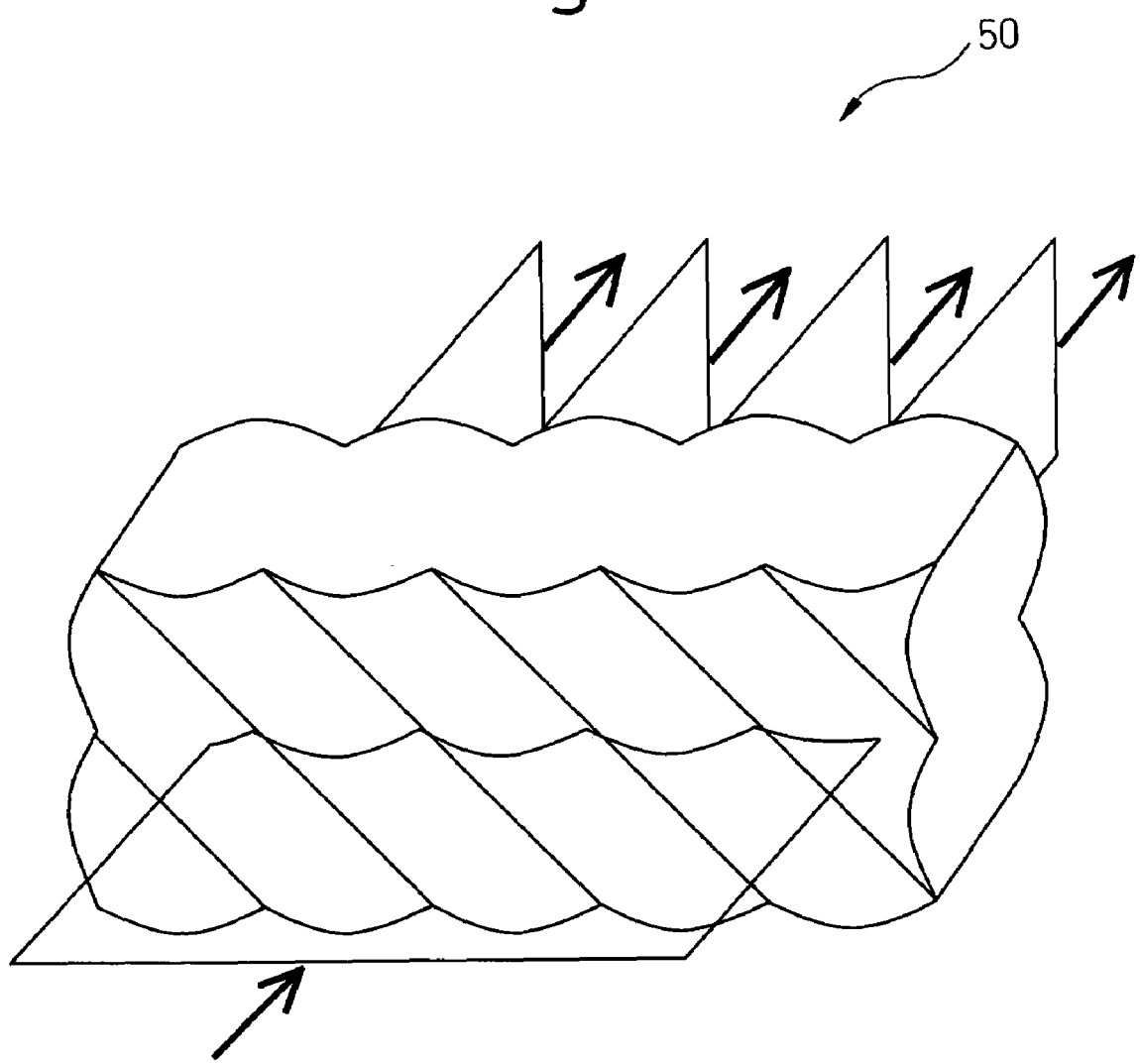
FIG. 12 is a perspective view of a beam converter made from an optical glass block according to the exemplary embodiment of the present invention, and beam conversion to be achieved.
Figure 13A:
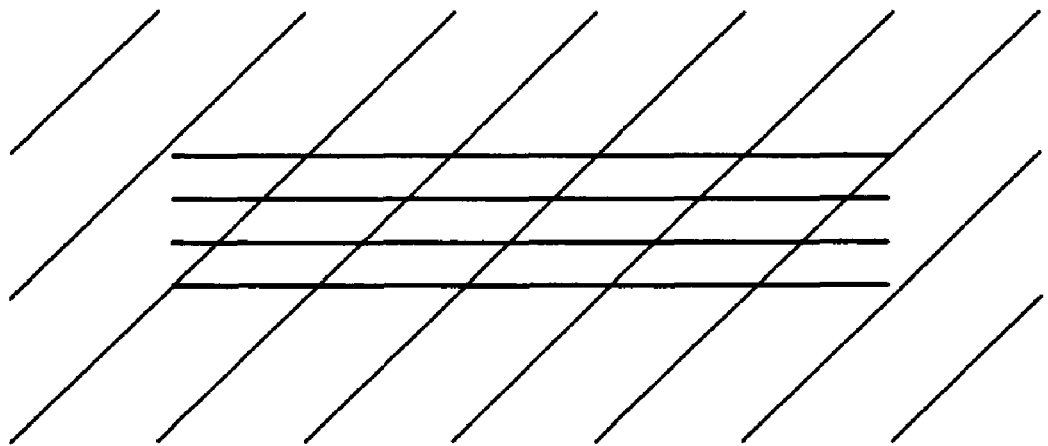
FIG. 13A and FIG. 13B are explanatory diagrams of exemplary shapes of a beam attained before and after the beam passes through a beam converter, respectively.
Figure 13B:
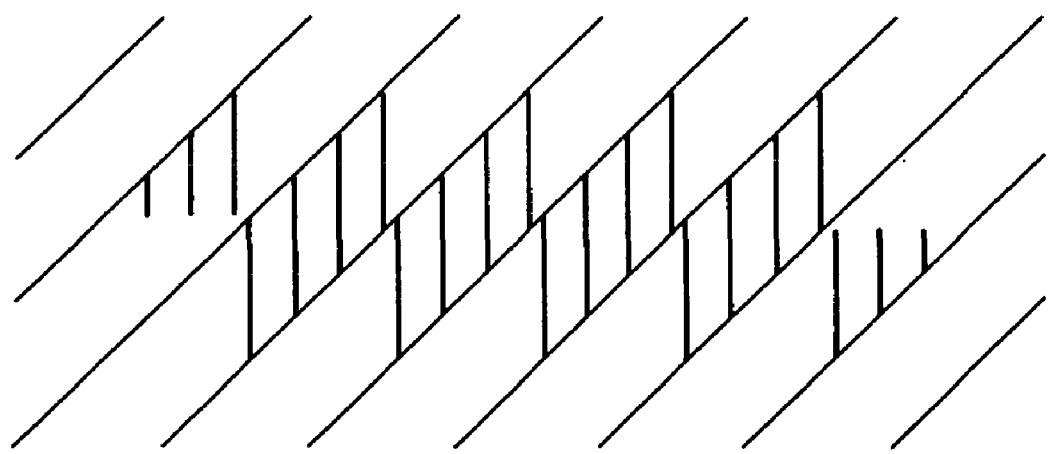

FIG. 12 shows a beam converter 50 formed with a monolithic optical glass prism having pairs of cylindrical lenses juxtaposed with the optical axes thereof tilted 45° with respect to the fast axis. In the beam converter 50, a flat light beam falling horizontally on the incidence surface of the beam converter 50 undergoes refracting forces that are associated with the positions of incidence of components and that are exerted by the cylindrical lenses tilted 45°. Consequently, the ray axis of the flat light beam is turned. Furthermore, the ray axis of the flat light beam can be turned by the other emission-side cylindrical lens tilted 45°. In addition, the flat light beam having the ray axis thereof turned 90° in total can be emitted from the emission side of the beam converter. FIGS. 13A and 13B show the conditions of the laser beam attained before and after it passes through the beam converter 50.

Figure 14:
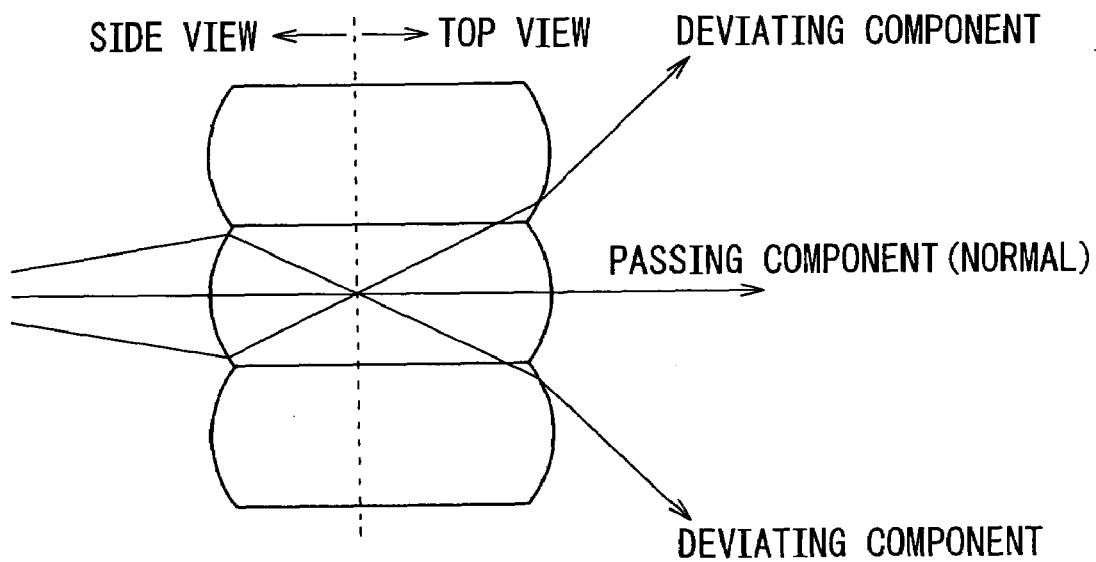
FIG. 14 is an explanatory diagram of a production of components (e.g., deviating components) of beams that invade into an adjoining element on a beam-emission side according to the exemplary embodiment of the present invention.

Exemplary embodiments of the present invention can use the beam converter 50 formed with a cylindrical lens array. For example, when a laser beam exhibiting a certain angle of divergence falls on the beam converter 50 formed with the cylindrical lens array, components of the laser beams (deviating components) invade, as shown in FIG. 14, into an adjoining optical element on the emission side of the beam converter. This may bring about a "ghost" effect, and can result in a degradation of efficiency in laser beam propagation.

Figure 15:
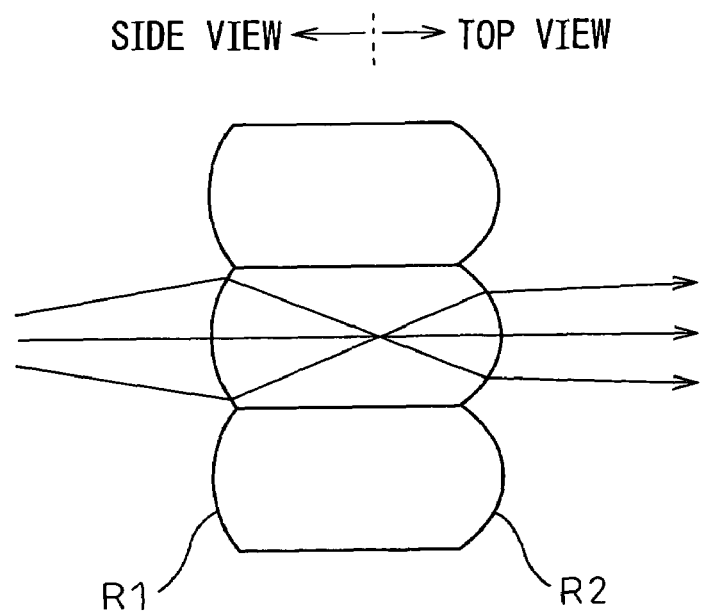
FIG. 15 is an explanatory diagram of a production of components of a beam converter whose beam emission-side cylindrical lens has a smaller curvature than a beam incidence-side cylindrical lens does according to the exemplary embodiment of the present invention.

In order to reduce the ghost effect deriving from the angle of divergence of an incident beam, it may be preferable for a converter to have the ability to adjust the angle of divergence. Therefore, the curvature of cylindrical lenses on a beam emission side of the converter can be, as shown in FIG. 15, made smaller than the curvature of cylindrical lenses on the beam incidence side thereof. This may lead to a reduction in the size of beams on the beam emission side. In this manner, components of laser beams (e.g., the deviating components) that invade into an adjoining optical element on the emission side of the converter may be eliminated, and the occurrence of the ghost effects may be suppressed.

However, for example, when R2/R2<1 is established, laser beams are not turned 90°. This problem can be solved by disposing a cylindrical lens at an angle. This type of an operation can be exerted by employing, aside from the cylindrical lens, a binary optic device or an optical device whose refractive index is, e.g., continuously varied.

Another exemplary embodiment of the semiconductor laser apparatus in accordance with the present invention may include a single stacked-array laser diode 10 or a plurality of stacked-array laser diodes 10. The power output of a stacked-array laser diode that is currently locally procurable is about 50 W. The number of layers included in the stacked-array laser diode is restricted to about 20 due to assembling precision. The power output of one stacked-array laser diode is therefore about 1 kW at most. However, unless the stacked-array laser diode provides a larger power output, it will not be applied to metalworking.

The groups of laser beams emitted from at least two stacked-array laser diodes 10 are combined in order to provide a large power output. This becomes possible using a technique of combining the groups of laser beams through polarization, a technique of combining them in terms of wavelengths, and a technique of combining them spatially. Moreover, a position at which the groups of laser beams are combined may be a position in front of the first cylindrical lens array 20 or a position in front of the group of cylindrical lenses 60 (or in other words, behind the condenser lens 70).

Figure 16:
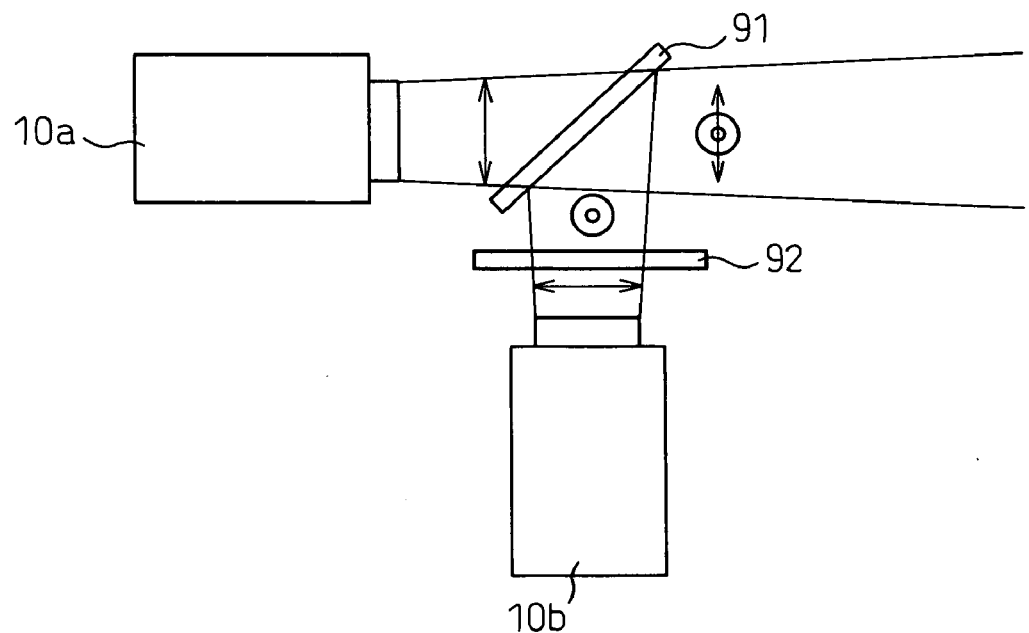
FIG. 16 is an explanatory diagram of an exemplary apparatus of the present invention in a mode in which a polarization device is used to combine two groups of laser beams.

FIG. 16 is a diagram showing an example in which an exemplary polarization device in accordance with the present invention can be used as a device that combines groups of laser beams radiated from a plurality of stacked-array laser diodes 10. A group of laser beams emitted from one stacked-array laser diode 10b is passed through a half-wave plate 92 and then combined with a laser beam emitted from the other stacked-array laser diode 10a via a polarization device (a polarization beam splitter) 91.

Figure 17:
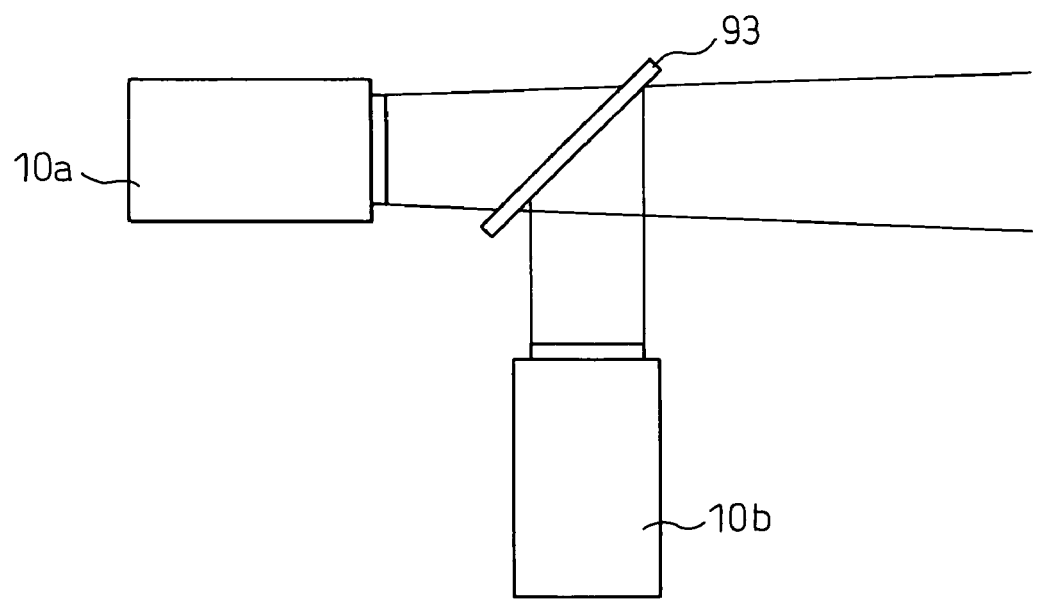
FIG. 17 is an explanatory diagram of another exemplary apparatus of the present invention in which a wavelength selection device is used to combine two groups of laser beams.

FIG. 17 is another diagram showing a further example in which a wavelength selection device is used as a device that combines groups of laser beams radiated from a plurality of stacked-array laser diodes 10. In this case, assume that the wavelength of laser beams emitted from a stacked-array laser diode 10a is λ1 and the wavelength of laser beams emitted from the other stacked-array laser diode 10b is λ2 different from λ1. The wavelength selection device 93 is an optical device generally called a dichroic mirror that reflects laser beams having the wavelength λ2 and transmits laser beams having the wavelength λ1. The laser beams emitted from the stacked-array laser diode 10b are therefore reflected from the optical device 93 and combined with laser beams emitted from the stacked-array laser diode 10a and then transmitted by the wavelength selection device 93.

Figure 18A:
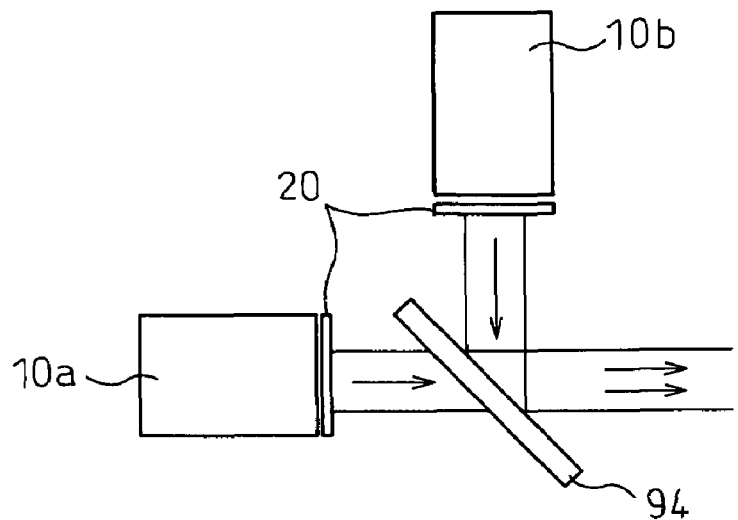
FIG. 18A and FIG. 18B are side view and plan view diagrams, respectively, of exemplary arrangements of the present invention in which a mirror having transmission windows arranged at intervals of approximately the same pitch as a pitch between adjoining ones of emitters included in a stacked-array laser diode is used to combine two groups of laser beams.
Figure 18B:
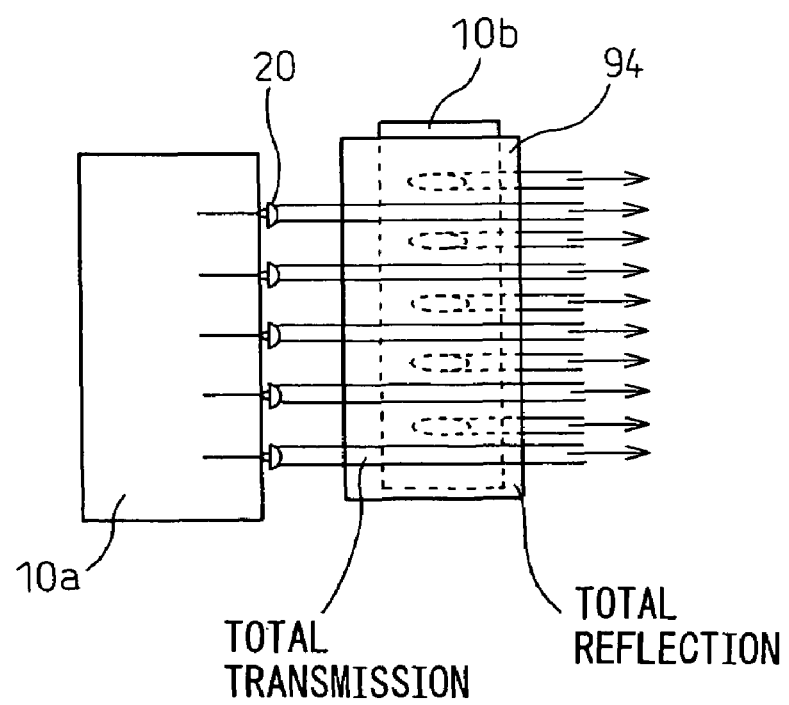

FIGS. 18A and 18B show diagrams providing an example in which groups of laser beams radiated from a plurality of stacked-array laser diodes 10 are spatially combined with each other. FIG. 18A is a side view, and FIG. 18B is a plan view. The laser beams emitted from a stacked-array laser diode 10b are reflected from an optical device 94. The laser beams emitted from a stacked-array laser diode 10a can be transmitted by a mirror (e.g., optical device 94) having transmission windows formed at intervals of the same pitch as the pitch between adjoining active layers in the stacked-array laser diode, and then combined with the laser beams emitted from the stacked-array laser diode 10b. In this case, the optical device 94 may be realized with a monolithic mirror having the transmission windows or by layering individual mirrors or prisms.

According to exemplary embodiments of the present invention, the semiconductor laser apparatus employing a stacked-array laser diode can route the laser beams to an ordinary optical fiber. The stacked-array laser diode can be utilized for laser processing, which is a major industrial field of application of a high-power laser, or medical purposes in a general-purpose manner.

The exemplary embodiments of the semiconductor laser apparatus in accordance can be widely used for, for example, laser processing or medical purposes.

Many different embodiments of the present invention may be constructed without departing from the spirit and scope of the present invention, and it should be understood that the present invention is not limited to the specific embodiments described in this specification, except as defined in the appended claims.

What is claimed is:

1. A semiconductor laser apparatus comprising:

a stacked-array arrangement which includes at least one of a single stacked-array laser diode or a plurality of stacked-array laser diodes that has a plurality of emitters, the array arrangement being elongated in a direction along a direction of an emission of laser beams, the arrangement including first elements that are arranged in a first direction and second elements that are arranged in a second direction which is orthogonal to the first direction so as to form a two-dimensional array, the arrangement being capable of causing an irradiation of the laser beams which are layered in rows;

a first condenser being disposed in front of the stacked-array arrangement, and being capable of refracting the laser beams in a row by row manner in the second direction so as to collimate the laser beams;

a first beam compressor being disposed in front of the first condenser, and being capable of receiving the laser beams that are collimated approximately in the second direction, the first beam compressor being capable of converting the collimated laser beams into a group of laser beams having an inter-ray axis distance thereof approximately in the second direction which is shortened, and causing the group of laser beams to be irradiated;

a separating optical device being disposed in front of the first beam compressor, the separating optical device being capable of separating the group of laser beams into subgroups of laser beams approximately along the first direction, and deflecting the subgroups of laser beams so that the subgroups of laser beams extend approximately along the first direction and recede from one another approximately along the second direction;

a collimating optical device being disposed in front of the separating optical device and capable of deflecting the subgroups of laser beams approximately along the first and second directions by approximately the same angles as the angles by which the separating optical device has deflected the subgroups of the laser beams, and in directions opposite to the directions in which the separating optical device has deflected the subgroups of laser beams;

a beam converter being disposed in front of the collimating optical device, the beam converter including further optical devices, the further optical devices being capable of dividing each of the subgroups of laser beams, and being included in a row in the laser beams, the subgroups of the laser beams being divided into portions and capable of bending nearly at right angles the axis of a section of the laser beams belonging to each portion, juxtaposed in rows, the beam converter being capable of receiving the group of laser beams emitted from the collimating optical device, allowing each of the further optical devices to turn the axis of a section of the laser beams belonging to each portion, and radiating a substantially ladder-shaped group of laser beams which extends approximately in the first direction in units of the laser beams belonging to each portion;

a second beam compressor being disposed in front of the beam converter, capable of converting the group of laser beams into a further group of laser beams that are compressed approximately in the first direction and emitting a resultant group of laser beams;

one or more cylindrical lenses being disposed in front of the second beam compressor and capable of facilitating an angle of divergence of the resultant group of the laser beams to be the first direction which is close to an angle of divergence in the second direction;

a condenser lens capable of converging the laser beams; and an optical fiber having an end surface thereof located at a position of the focal point of the condenser lens.

2. The semiconductor laser apparatus according to claim 1, further comprising an additional optical device capable of refracting the laser beams approximately in the second direction and causing the resultant group of laser beams to be emitted, the additional optical device being interposed between the collimating optical device and the beam converter.

3. The semiconductor laser apparatus according to claim 2, wherein the collimating optical device includes a cylindrical lens.

4. The semiconductor laser apparatus according to claim 1, wherein at least one of the first beam compressor or the second beam compressor includes a telescope that is formed with at least one of a lens or a mirror exhibiting a curvature in a single direction.

5. The semiconductor laser apparatus according to claim 1, wherein at least one of the first beam compressor or the second beam compressor includes at least one of an anamorphic prism or a pair of anamorphic prisms.

6. The semiconductor laser apparatus according to claim 1, wherein the beam converter includes compound optical devices, each of the compound optical devices including:

a) a receiver which is capable of receiving an incident beam whose section that is perpendicular to the optical axis of the compound optical device has a first axis, b) a turning optical system which is capable of turning the first axis of the section of the incident beam approximately at right angles, and c) an emitter which is capable of emitting a further light beam that passes through the turning optical system so that the receiver and the emitter of each of the compound optical devices are flushed with each other and adjacently to each other along the ray axes of laser beams.

7. The semiconductor laser apparatus according to claim 6, wherein the compound optical device has the shape which is determined based on reflecting surfaces thereof, the reflecting surfaces including:

a) a first reflecting surface provided vertically to meet the incident beam at an angle of approximately 45°, b) a second reflecting surface provided to be parallel to the incident beam and meet a horizontal surface at an angle of nearly 45°, and c) a third reflecting surface which is perpendicular to a vertical surface, the incident beam, and a line of intersection between the first and second reflecting surfaces, the third reflecting surface being provided to meet the horizontal surface at an angle of nearly 45°.

8. The semiconductor laser apparatus according to claim 6, wherein:

the beam converter includes a plurality of prisms each having a first totally reflecting surface, a second totally reflecting surface, a third totally reflecting surface, an incidence surface, an emission surface, and a joint surface, the first, second, and third totally reflecting surfaces of each of the plurality of prisms intersect at an angle of approximately 60°, the incidence surface and the emission surface that are parallel to each other are orthogonal to the second totally reflecting surface and meet the first and third totally reflecting surfaces at an angle of approximately 45°, and the joint surface being parallel to the second totally reflecting surface, and the beam converter has the plurality of prisms arranged in the form of a one-dimensional array so that the third totally reflecting surfaces, the incidence surfaces, and the emission surfaces of the plurality of prisms are flushed with one another adjacently to one another, and the joint surfaces and the second surfaces thereof are joined.

9. The semiconductor laser apparatus according to claim 6, wherein:

the beam converter has optical glass bodies juxtaposed in the form of a one-dimensional array, each of the optical glass bodies has first and second flat surfaces that are parallel to each other, a third flat surface that meets the first flat surface at an angle of 135°, and a fourth surface that is a cyclically folded surface having ridges and valleys, wherein along each of the ridges and valleys, slopes meet at an angle of 60° and parallel to the third flat surface, and is formed alternately and continuously to intersect the first flat surface at an angle of $\tan^{-1}(1/\sqrt{2})$, and the first flat surface serves as an incidence surface, the second flat surface serves as an emission surface, slopes of the fourth surface that meet the first flat surface at an angle of 45° serving as first reflecting surfaces, further slopes of the fourth flat surface serving as second reflecting surfaces, and the third flat surface serving as a third reflecting surface.

10. The semiconductor laser apparatus as claimed in claim 7, wherein:

the beam converter has mirror structures juxtaposed in the form of a one-dimensional array, each of the mirror structures has a first flat surface that meets a flat surface perpendicular to an incident ray axis at an angle of approximately 135°, and a second surface that is a cyclically folded surface having ridges and valleys, along each of the ridges and valleys, slopes meet at an angle of approximately 60° and each of slopes is parallel to the first flat surface, formed alternately and continuously to meet the first flat surface, which is perpendicular to an incident ray axis at an angle of $\tan^{-1}(1/\sqrt{2})$, the first flat surface and the second surface include mirrors, and slopes of the second surface that meet a portion of the first flat surface that is perpendicular to the incident ray axis serve as first reflecting surfaces, and other slopes of the second surface serve as second reflecting surfaces, and the first flat surface serves as a third reflecting surface.

11. The semiconductor laser apparatus according to claim 6, wherein the beam converter has a plurality of pairs of convex cylindrical lenses which include optical axes that are tilted at about 45°, and which are provided opposite to each other, and juxtaposed in the form of a one-dimensional array.

12. The semiconductor laser apparatus according to claim 11, wherein a curvature of an emission-side lens of each pair of the cylindrical lenses is smaller than a curvature of an incidence-side lens thereof.

13. The semiconductor laser apparatus according to claim 6, wherein the beam converter has a plurality of the cylindrical lenses, each of the cylindrical lenses has a convex lens portion formed at both lateral ends thereof, joined at an angle of nearly 45° with respect to the incident ray axis in the form of a one-dimensional array.

14. The semiconductor laser apparatus as claimed in claim 13, wherein a curvature of an emission side of the convex lens portion is smaller than a curvature of an incidence side of the convex lens portion.

15. The semiconductor laser apparatus as claimed in claim 6, wherein the beam converter has a plurality of cylindrical surfaces which are tilted nearly 45° in the same direction, formed on an incidence side and an emission side of an optical glass prism that has a rectangular section, and provided such that a beam incident on each of the cylindrical surface is emitted with the section thereof turned nearly 90°.

16. The semiconductor laser apparatus as claimed in claim 15, wherein a curvature of the cylindrical surfaces formed on the emission side is smaller than a curvature of those formed on the incidence side.

17. The semiconductor laser apparatus as claimed in claim 6, wherein the optical device is a dove prism having a trapezoidal section, and a plurality of optical devices is tilted nearly 45°.

18. The semiconductor laser apparatus as claimed in claim 6, wherein the optical device has a plurality of pairs of optical elements, each of the pairs of optical elements varying power in a direction that is perpendicular to a center axis thereof due to diffraction, opposite to one another, and having the center axes of the pairs of optical elements being tilted nearly 45°.

19. The semiconductor laser apparatus as claimed in claim 1, wherein:

the stacked array arrangement includes at least two stacked-array laser diodes, the first condenser is disposed in front of each of the stacked-array laser diodes, and the combining optical device that combines the group of laser beams which is emitted from one of the condensers with a group of laser beams emitted from the other condenser is disposed in front of at least one of the condensers.

20. The semiconductor laser apparatus as claimed in claim 1, wherein the stacked array arrangement includes at least two stacked-array laser diodes, and the combining optical device that combines at least two groups of the laser beams incident on a condenser lens is disposed behind the condenser lens.

21. The semiconductor laser apparatus as claimed in claim 1, wherein:

the stacked array arrangement includes at least three stacked-array laser diodes, each having the first condenser disposed in front thereof, and the combining optical device that combines at least two groups of the laser beams is disposed at least one of in front of the first condensers or behind the condenser lens on which the two groups of laser beams are disposed.

22. The semiconductor laser apparatus as claimed in claim 1, wherein the combining optical device includes at least one of a polarization device or a dichroic mirror.

23. The semiconductor laser apparatus as claimed in claim 1, wherein the combining optical device has mirrors arranged at intervals of approximately the same pitch as a pitch between adjoining ones of the emitters included in the stacked-array arrangement.

* * * * *